United States Patent [19]
Hamasaki

[11] Patent Number: 5,229,630
[45] Date of Patent: Jul. 20, 1993

[54] CHARGE TRANSFER AND/OR AMPLIFYING DEVICE OF LOW NOISE TO DETECT SIGNAL CHARGES AT A HIGH CONVERSION EFFICIENCY

[75] Inventor: Masaharu Hamasaki, Kanagawa, Japan

[73] Assignee: Sony Corporation, Tokyo, Japan

[21] Appl. No.: 773,446

[22] Filed: Oct. 9, 1991

[30] Foreign Application Priority Data

Oct. 12, 1990 [JP] Japan .................... 2-274219

[51] Int. Cl.$^5$ .................... H01L 29/796; E11C 19/28
[52] U.S. Cl. .................... 257/239; 257/224; 257/262; 377/60
[58] Field of Search .................... 357/24; 377/57-63; 257/224, 239

[56] References Cited

U.S. PATENT DOCUMENTS

| | | | |
|---|---|---|---|
| 3,918,070 | 11/1975 | Shannon | 357/24 M |
| 4,074,302 | 2/1978 | Brewer | 357/24 M |
| 4,672,645 | 6/1987 | Bluzer et al. | 357/24 M |
| 4,984,045 | 1/1991 | Matsunaga | 357/24 M |

Primary Examiner—Gene M. Munson
Attorney, Agent, or Firm—Hill, Steadman & Simpson

[57] ABSTRACT

A charge transfer and/or amplifying device includes a surface channel region of opposite conductivity type formed on the surface of a charge transfer buried channel region, a junction gate type field effect transistor formed of source and drain regions separated from each other by the buried channel region and the surface channel region and an insulated gate electrode formed on the surface channel region, wherein the gate electrode and the source region of the junction gate type field effect transistor are electrically coupled to thereby enhance a conversion efficiency.

4 Claims, 2 Drawing Sheets

CHARGE TRANSFER AND/OR AMPLIFYING DEVICE OF LOW NOISE TO DETECT SIGNAL CHARGES AT A HIGH CONVERSION EFFICIENCY

BACKGROUND OF THE INVENTION

1. Field of the Invention

The present invention generally relates to charge transfer and/or amplifying devices and more particularly to a charge transfer and/or amplifying device of low noise which can detect signal charges at high conversion efficiency.

2. Description of the Prior Art

Various methods have been proposed so far to detect signal charges transferred by a charge-coupled device (CCD) and in this case, a floating diffusion amplifier (FDA) is frequently utilized for this purpose. The FDA, however, has the disadvantage such that, when a floating diffusion region is preset to a predetermined potential by a pre-charge gate, a large reset noise is produced. Also, in addition to the reset noise, a low frequency (1/f) noise, white noise and so on of a metal-oxide semiconductor (MOS) transistor exist and these noises are too large to be neglected.

For this reason, a video camera or the like using a CCD employs a correlation double sampling (CDS) circuit in order to reduce the noise. In this case, if a conversion efficiency is enhanced, then the reset noise becomes large. There is then the disadvantage that the large reset noise cannot be removed fully by the above CDS circuit.

Further, since the apparatus corresponding to a high definition television receiver (HDTV) system is operable at higher speed, a time enough for the CDS processing cannot be afforded, which unavoidably causes the reset noise or the like to be increased.

Therefore, it is proposed to remove the reset noise by improving the FDA so as to cope with the HDTV system, thereby enhancing the conversion efficiency. One of such proposals is reported in "High sensitivity charge detector for CCD" pp. 51 to 52.2-12 of preliminary article for national conference held by the Institute of Television Engineers of Japan on 1988, and also another proposal is reported in "ring-junction gate type low noise CCD charge detector" pp. 27 to 28.2-8 of preliminary article for national conference held by the Institute of Television Engineers of Japan on 1989.

According to the former proposal, a p-type channel of a detecting transistor is formed beneath a CCD buried channel region, whereby signal charges are transferred to the direction vertical to the channel of the detecting transistor by the buried channel region. Accordingly, a current flowing through the p-type channel of the detecting transistor is modulated by the transferred signal charge so that the signal charge can be detected from the above current.

In accordance with the latter proposal, a junction gate type field effect transistor (FET) employing a p-type well as a channel is disposed between an output gate and a reset gate, which is used as a driving transistor of a first stage source-follower amplifier. Since the gate of the junction gate type FET is the ring junction gate (RJG) unitarily formed with the charge detection capacitance, this transfer charge amplifying device is called a ring junction gate CCD charge detector. According to the principle of the transfer charge amplifying device, signal charges transferred through the CCD are accumulated in the junction gate and a drain current of the above-mentioned junction gate FET is modulated by the resultant potential fluctuation and the modulated drain current is transmitted to the source follower amplifier of the next stage.

The above-mentioned transfer charge amplifying devices of the improved type have the advantages such that the reset noise can be removed because they can discharge the signal charges fully by the complete transfer process. However, a hole current, which is a modulated current, is passed through the buried channel region and the depth of the buried channel region through which the hole current is passed is so large from the surface of the semiconductor substrate that a short-channel effect is large. Therefore, the mutual conductance (gm) cannot be increased and as a result the conversion efficiency cannot be enhanced. In this case, if the conversion efficiency is unreasonably enhanced, then the operation speed is decreased.

OBJECTS AND SUMMARY OF THE INVENTION

Accordingly, it is an object of the present invention to provide an improved charge transfer and/or amplifying device in which the aforementioned shortcomings and disadvantages encountered with the prior art can be eliminated.

More specifically, it is an object of the present invention to provide a charge transfer and/or amplifying device which can detect signal charges at high conversion efficiency.

Another object of the present invention is to provide a charge transfer and/or amplifying device of low noise.

As an aspect of the present invention, a charge transfer and/or amplifying device in which on the surface of a charge transfer buried channel region, a surface channel region of opposite conductivity type is formed, a junction gate type field effect transistor is formed of source and drain regions separated from each other by the buried channel region and the surface channel region, and an insulated gate electrode is formed on the surface channel region, wherein the gate electrode and the source region of the junction gate type field effect transistor are electrically coupled to each other.

Therefore, according to the charge transfer and/or amplifying device of the present invention, a signal charge can be detected by modulating a drain current of the junction gate field effect transistor, the drain current flowing from the buried channel region to the surface channel region of the substrate surface side, by a signal charge flowing through the buried channel region. Also, since the surface channel region is formed on the surface side of the semiconductor substrate side, a so-called short channel effect can be avoided and a mutual conductance gm can be enhanced. Further, since the connection between the source of the junction gate field effect transistor and the insulated gate electrode constructs a positive feedback circuit, a conversion efficiency can be enhanced more.

BRIEF DESCRIPTION OF THE DRAWINGS

A better understanding of other objects, features and advantages of the present invention will be gained from the following detailed description of an illustrative embodiment thereof to be read in conjunction with the accompanying drawings, in which.

DETAILED DESCRIPTION OF THE PREFERRED EMBODIMENT

An embodiment of the charge transfer and/or amplifying device according to the present invention will hereinafter be described in detail with reference to the drawings.

Figure 1:
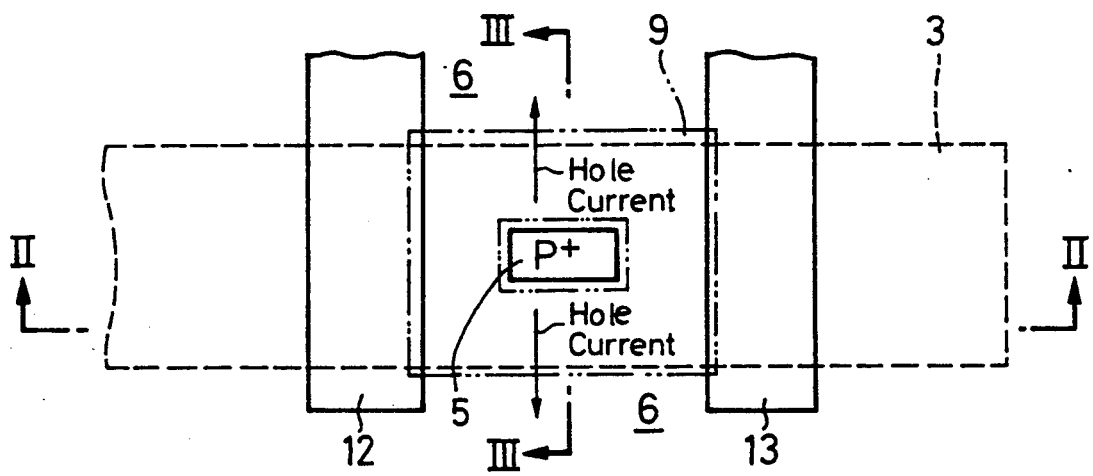
FIG. 1 is a plan view of an embodiment of a charge transfer and/or amplifying device according to the present invention.
Figure 2:
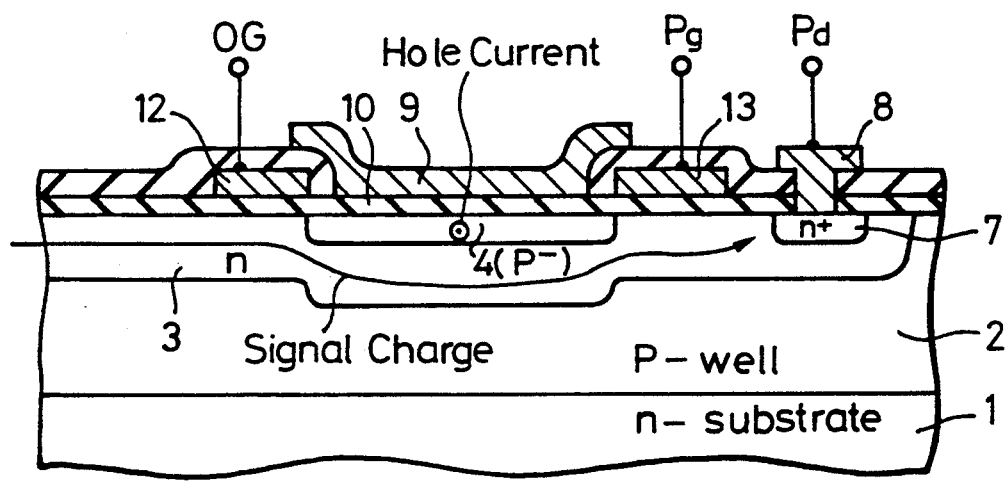
FIG. 2 is a cross-sectional view taken along the line II—II of FIG. 1.
Figure 3:
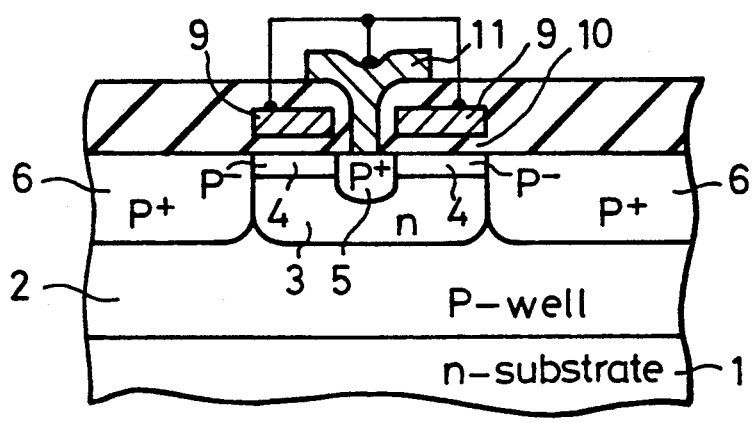
FIG. 3 is a cross-sectional view taken along the line III—III of FIG. 1.

FIGS. 1 to 3 show the structure of the charge transfer and/or amplifying device according to the present invention, wherein FIG. 1 is a plan view of the charge transfer and/or amplifying device according to the present invention, FIG. 2 is a cross-sectional view taken along the line II—II of FIG. 1 and FIG. 3 is a cross-sectional view taken along the line III—III of FIG. 1.

In the figures, reference numeral 1 depicts an n-type semiconductor substrate, 2 a p-type well and 3 an n-type buried channel region for transferring charges selectively formed on the surface of the p-type well 2. Signal charges of the CCD are transferred to this n-type buried channel region 3 and in the case of, for example, the sensor, signal charges from the photoelectric conversion unit are injected into this n-type buried channel region 3. If the n-type buried channel region 3 is utilized as the output portion of the horizontal CCD, then signal charges transferred by the change of voltage of the horizontal transfer electrode are injected into the n-type buried channel region 3. The n-type buried channel region 3 is shown by a broken line block in FIG. 3.

A p− type surface channel region 4 is selectively formed on the surface of the charge transferring n-type buried channel region 3 and forms the channel of the junction gate type FET which is the driving transistor of the charge transfer and/or amplifying device of the present invention. A p+ type semiconductor region 5 is formed at substantially the central portion of the surface channel region 4 so as to reach the n-type buried channel region 3 as shown in FIG. 3 and this p+ type semiconductor region 5 forms a source region of the above junction gate type FET, which then becomes an output point of the charge transfer and/or amplifying device of the present invention.

Drain regions 6, 6 are formed so as to sandwich the buried channel region 3 at its both sides, and the drain regions 6, 6, the source region 5 and the surface channel region 4 constitute the junction gate type FET. The charge transfer buried channel region 3 corresponds to the junction gate of the junction gate type FET.

A reset n+ channel-type diffusion layer 7 is formed on a region distant from the surface channel region 4 across a precharge gate, which will be described later, of the buried channel region 3. Transfer charges of the CCD are discharged, i.e., completely transferred through this diffusion layer 7. An electrode 8 coupled to the diffusion layer 7 is supplied with a constant reset potential.

A ring-shaped gate electrode 9 is formed so as to cover the surface channel region 4 through a gate insulating film 10 and an aluminum electrode 11 coupled to the source region 5 is communicated with an aperture formed through the central portion of the gate electrode 9. This gate electrode 9 and the aluminum electrode 11 are electrically connected to each other. The gate electrode 9 is shown by a two-dot chain line block in FIG. 1, and in FIGS. 1 and 2, reference numeral 12 depicts an output gate and 13 a pre-charge gate.

An outline of the arrangement of the charge transfer and/or amplifying device of the present invention will be described below.

The thin p− type surface channel region 4 is formed on the surface of the n-type buried channel region 3 to which signal charges from the CCD are transferred. This thin p− type surface channel region 4 is employed as the channel through which the hole current is flowed. The source region (p+ type) 5 and the drain region 6 of the junction gate type FET which employs this surface channel region 4 as the channel are also formed on the surface side of the n-type buried channel region 3, and the n-type well 2 in which the buried channel region 3 is formed, the above drain region 6 and the source region 5 are separated by the buried channel region 3 and the surface channel region 4.

The insulating gate electrode 11 is formed on the surface side of the surface channel region 4 and the insulating gate electrode 11 and the source region 5 of the junction gate type FET are electrically connected to each other.

Figure 4:
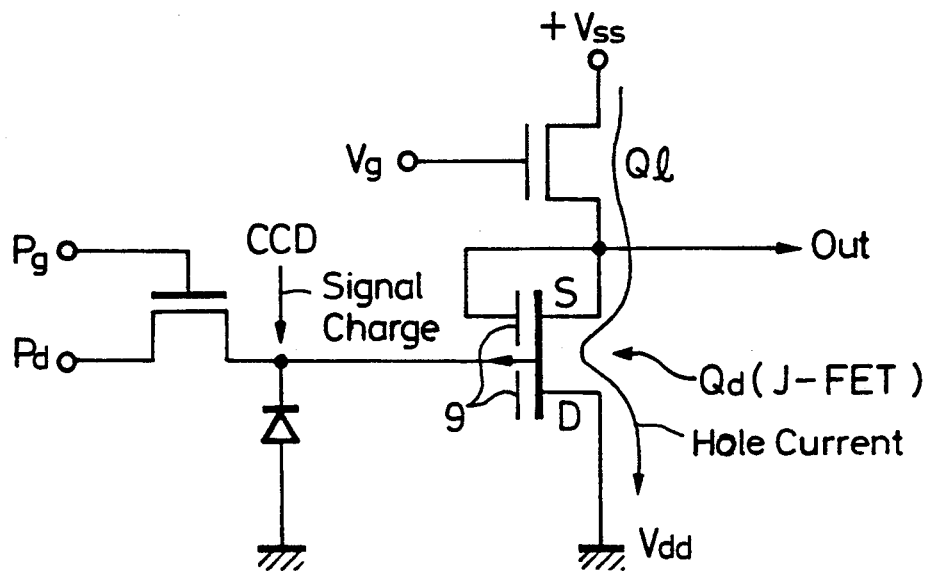
FIG. 4 is a schematic diagram showing a circuit arrangement of the charge transfer and/or amplifying device of the present invention.

FIG. 4 shows a circuit configuration of the charge transfer and/or amplifying device according to the present invention. In FIG. 4, reference symbol Qd represents a driving transistor formed of the above junction gate type FET and this driving transistor Qd is coupled to a load transistor (i.e., MOSFET) Ql to thereby construct a source-follower circuit. The source region 5, which is the output point of this source-follower circuit, and the insulating gate electrode 9 are electrically connected to each other, whereby the capacitance between the p+ type surface channel region 4 and the gate electrode 9 is effectively increased by (1-G) times where G is the gain of the source-follower circuit and is less than 1. For example, assuming that this gain G is selected to be 0.9, then a capacitance Cox between the surface channel region 4 and the gate electrode 9 becomes 1/10 effectively, which therefore decreases the input capacitance to 1/10. As a consequence, since the input capacitance is reduced, the conversion efficiency can be enhanced.

Further, since the source region 5 and the insulating gate electrode 9 are electrically coupled to each other, the output can be positively fed back to the input side and the conversion efficiency can be enhanced by the positive feedback. That is, when the hole current of the junction gate type FET is flowed, the feedback is effected so as to increase this hole current.

If the signal charge from the CCD is increased, then the hole current flowing through the driving transistor Qd of the above junction gate type FET also is increased accordingly. Then, the potential at the source region 5 of the junction gate type FET is lowered and the potential at the gate electrode 11 also is lowered so that holes are much more induced on the surface channel region 4, thereby the hole current being increased. By the repetition of the above-mentioned process, the hole current is increased much more, that is, positively fedback. Therefore, the conversion efficiency can be increased, in which case the hole current can be suppressed from being increased freely by a so-called back bias effect.

Figure 5:
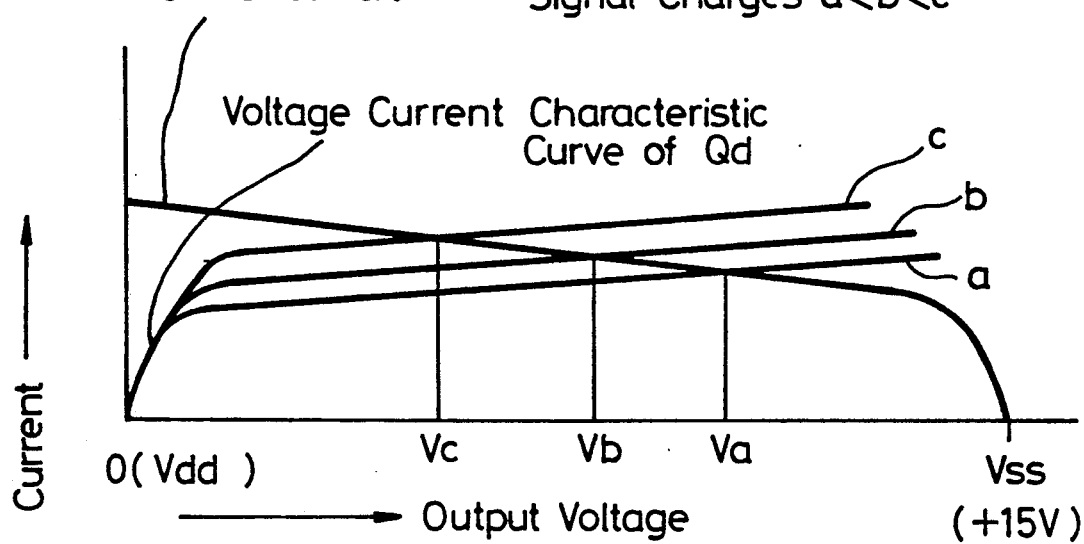
FIG. 5 is a diagram showing characteristic curves to which references will be made in explaining operation of the circuit shown in FIG. 4.

FIG. 5 is a diagram of characteristic curves to which references will be made in explaining operation of the circuit formed of the junction gate type FET Qd and the load MOSFET Ql shown in FIG. 4. Since the load MOSFET Ql is supplied at its gate with a constant potential, the voltage-current characteristic curve (i.e., this curve corresponds to a so-called load curve, wherein the load in this embodiment is not a resistor but the MOS transistor so that the characteristic is presented not by the straight line but by the curve) thereof is not changed.

The junction gate type field effect transistor Qd exhibits a constant current characteristic, the inclination of which is gentle except the leading edge portion thereof, and a voltage current characteristic thereof is changed by the transferred signal charge. In FIG. 5, a demonstrate a characteristic curve of a certain signal charge, b demonstrates a characteristic curve when there are much signal charges, and c demonstrates a characteristic curve when there are much more signal charges. In this case, the positive feedback is effected so that the shifted amount by the signal charge of the voltage current characteristic curve is increased. Accordingly, a point in which the characteristic curves and a voltage characteristic curve of the load MOSFET cross each other, that is, an operation point is considerably changed by the amount of signal charges. Since the inclination of the voltage current characteristic curve of the junction gate FET Qd is gentle as earlier noted, the operation point is considerably changed (Va, Vb, Vc) even by a very small change of the signal charge (a, b, c) as viewed from the voltage axis. Thus, the very small change of the signal charge appears as a large change of the output voltage, which can enhance the conversion efficiency.

Incidentally, the signal charges from the CCD side are introduced to the buried channel region 3 so that they travel through the underside of the output gate 12, the underside of the surface channel region 4, the underside of the pre-charge gate 9 and the n+ type diffusion region 7 to the buried channel region 3 and can be completely discharged from the diffusion region 7. That is, the signal charges can be transferred completely. Therefore, the reset noise can be removed similarly to the case of the aforementioned improved charge transfer device.

Since the hole current modulated is passed through the surface channel region 4 unlike the conventional improved charge transfer and/or amplifying device, the short channel effect can be avoided. In addition, since the source region 5 of the junction gate type field effect transistor is electrically coupled to the insulating gate electrode 9, the positive feedback can be effected and hence, the conversion efficiency can be enhanced.

As set out above, the charge transfer and/or amplifying device according to the present invention is comprised of a second conductivity type buried channel region for transferring charges formed within a first conductivity type well on the surface portion of a semiconductor substrate, a junction gate field effect transistor (FET) composed of first conductivity type source and drain regions spaced apart by the buried channel region and a first conductivity type surface channel region formed on the surface portion of the charge transferring buried channel region, and an insulating gate electrode formed on the surface channel region through an insulating film, wherein a source region of the junction gate field effect transistor and the insulating gate electrode are electrically connected to each other.

Therefore, according to the charge transfer and/or amplifying device of the present invention, a signal charge can be detected by modulating a drain current of the junction gate field effect transistor, the drain current flowing from the buried channel region to the surface channel region of the substrate surface side, by a signal charge flowing through the buried channel region. Also, since the surface channel region is formed on the surface side of the semiconductor substrate side, a so-called short channel effect can be avoided and a mutual conductance gm can be enhanced. Further, since the connection between the source of the junction gate field effect transistor and the gate electrode constructs a positive feedback circuit, a conversion efficiency can be enhanced more.

Having described the preferred embodiment of the invention with reference to the accompanying drawings, it is to be understood that the invention is not limited to that precise embodiment and that various changes and modifications thereof could be effected by one skilled in the art without departing from the spirit or scope of the novel concepts of the invention as defined in the appended claims.

I claim:

1. A charge transfer and/or amplifying device comprising:
   (a) a substrate of a first conductivity type;
   (b) a well of a second conductivity type formed on said substrate;
   (c) a buried channel region of the first conductivity type formed within said well on the surface portion of said substrate of the first conductivity type, said buried channel region transferring signal charges;
   (d) a junction type field effect transistor composed of a source region and a drain region of the second conductivity type separated by said buried channel region and a surface channel region of the second conductivity type formed on the surface portion of said buried channel region and a gate electrode formed on said surface channel region through an insulating layer;
   wherein said source region of said junction type field effect transistor and said gate electrode are electrically connected to each other in a direct short circuit to provide for positive feedback.

2. A charge transfer and/or amplifying device as claimed is claim 1, wherein a signal charge from a photo-electric converting unit is injected into said buried channel region.

3. A charge transfer and/or amplifying device as claimed in claim 1, wherein a signal charge from a horizontal transfer register is injected into said buried channel region.

4. A charge transfer and/or amplifying device according to claim 1, further comprising a pre-charge gate and a reset drain region wherein said pre-charge gate is turned on, the signal charge is discharged to said reset drain region.

* * * * *